(12) United States Patent
Abraham et al.

(10) Patent No.: US 7,536,612 B2
(45) Date of Patent: May 19, 2009

(54) FIELD SPIKE MONITOR FOR MRAM

(75) Inventors: David Abraham, Croton, NY (US);
Philip L. Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 1223 days.

(21) Appl. No.: 10/652,510

(22) Filed: Aug. 29, 2003

(65) Prior Publication Data

US 2005/0050399 A1    Mar. 3, 2005

(51) Int. Cl.
*G11C 29/00*    (2006.01)
*G11C 7/00*    (2006.01)

(52) U.S. Cl. ................... 714/718; 365/201; 365/209

(58) Field of Classification Search ............ 714/6, 714/47, 718, 719, 721; 365/171, 173, 200, 365/201, 209
See application file for complete search history.

(56) References Cited

U.S. PATENT DOCUMENTS

| | | | |
|---|---|---|---|
| 5,111,457 A * | 5/1992 | Rabjohns et al. ............ 714/6 |
| 5,617,071 A | 4/1997 | Daughton ................ 338/32 |
| 6,072,718 A | 6/2000 | Abraham et al. ............ 365/173 |
| 6,368,878 B1 | 4/2002 | Abraham et al. ............ 438/3 |
| 6,385,082 B1 | 5/2002 | Abraham et al. ............ 365/171 |
| 6,985,381 B2 * | 1/2006 | Bhattacharyya et al. ..... 365/158 |

OTHER PUBLICATIONS

"Memories of Tomorrow" by Reohr et al. IEEE Circuits and Devices Magazine, Publication Date: Sep. 2002 vol. 18, Issue: 5 On pp. 17-27 ISSN: 8755-3996 INSPEC Accession No. 7416303.*

* cited by examiner

*Primary Examiner*—Cynthia Britt
(74) *Attorney, Agent, or Firm*—F.Chau & Associates, LLC

(57) ABSTRACT

A method for monitoring field events in an MRAM memory device comprises providing a first magnetic storage cell having a switching threshold less than or equal to a switching threshold of a second magnetic storage cell, writing the first magnetic storage cell in a first direction, reading the first storage cell at a time after the writing, and determining whether the first direction has changed, and upon determining the first direction to have changed indicating a warning.

11 Claims, 8 Drawing Sheets

FIELD SPIKE MONITOR FOR MRAM

The U.S. Government has a paid-up license in this invention and the right in limited circumstances to require the patent owner to license others on reasonable terms as provided for by the terms of grant no. MDA 972-99-C-0009, awarded by the Department of Defense, DARPA.

BACKGROUND OF INVENTION

1. Field of the Invention

The present invention relates to a memory array of magnetic storage cells, and more particularly to a monitor for detecting magnetic field events.

2. Discussion of Related Art

Magnetic random access memory (MRAM) technology utilizes storage cells. The storage cells or MTJ (Magnetic Tunnel Junction) each have at least two magnetic regions or layers with an electrically insulating barrier layer between them. The storage mechanism relies on the relative orientation of the magnetization of the two layers, and on the ability to discern this orientation by electrical means through electrodes attached to these layers.

MRAM memory arrays include an array of MTJs positioned at the intersections of wordlines and bitlines. Each MTJ includes a magnetically changeable (e.g., reversible) or free region, and a proximate magnetic reference or fixed region, arranged into an MTJ device. Reference region denotes any type of region which, in cooperation with the free or changeable region, results in a detectable state of the device as a whole.

The principle underlying storage of data in such cells is the ability to change, and even reverse, the relative orientation of the magnetization of the free and reference regions by changing the direction of magnetization along the easy axis (EA) of the free region, and the ability to thereafter read the relative orientation difference.

More particularly, data can be written to an MRAM cell by reversing the free region magnetization using applied bi-directional electrical and resultant magnetic stimuli via its respective bitline and wordline.

The MRAM cell is later read by measuring the resultant tunneling resistance of the device, which can assume different values depending on the relative orientation of the magnetization of the free region with respect to the reference region. If the free region is modeled as a simple elemental magnet having a direction of magnetization that is free to rotate but with a strong preference for aligning in either direction along its easy axis (+EA or −EA), and if the reference region is a similar elemental magnet but having a direction of magnetization fixed in the +EA direction, then two states, and therefore two possible tunneling resistance values, are defined for the cell: aligned (+EA/+EA) and anti-aligned (−EA/+EA).

As an example, and with reference to FIGS. 1a and 1b, in an MRAM array, magnetic memory cells are positioned at the intersections of an exemplary rectangular grid of electrically conductive lines 1-6. The lines are arranged over a substrate and cross, thereby forming intersecting regions at which the magnetic memory cells are positioned, e.g., magnetic memory cell 7. The MTJ 8 comprises at least two magnetic regions or layers with an electrically insulating barrier between them. The storage mechanism relies on the relative orientation of the magnetization of the two layers, and on the ability to discern the orientation through electrodes attached to the layers.

The MTJ 8 comprises a free magnetic region 9, a tunneling barrier layer 10, and a reference magnetic region 11. The ability of this type of storage cell to store electrically accessible data hinges on electron tunneling between these two regions, which in turn is dependent on the relative directions of magnetization of these two regions. Rotating the magnetization in the free region into one of two selectable directions in a bi-stable manner results in binary state stored in the storage cell. If the storage cell is oriented with its magnetic EA disposed horizontally then an electrical writing current flowing through a vertical line will apply an EA magnetic field to the cell, and a current flowing through a horizontal line will apply a hard-axis (HA) magnetic field to the cell.

In one implementation of MRAM cells, the writing of individual storage cells adheres to a concept referred to as an astroid for switching. The switching threshold of a single free region depends on a combination of EA and HA magnetic fields applied thereto. The Stoner-Wohlfarth astroid model, shown in FIG. 2, illustrates these threshold values in the plane of applied EA and HA fields. Switching occurs when the combination of EA and HA fields at the storage cell results in a vector outside of the astroid. Vectors inside the astroid will not switch the storage cell from a current bi-stable state. The astroid model also illustrates how the EA field needed to switch a device is reduced in the presence of an HA bias field. Selectively switching a single storage cell within the array is achieved by applying electrical currents through a selected pair of horizontal and vertical lines. These currents generate a combination of EA and HA fields only at the storage cell located at the intersection of these lines, switching the selected cell, but not the neighboring cells.

All the storage cells along the selected horizontal line will experience the same applied HA field. Similarly all the storage cells along the selected vertical line will experience the same applied EA field. However, only the storage cell at the intersection of these lines will experience the combination of both fields needed for switching.

While MRAM has demonstrated the capacity for long term retention of information, as with many magnetic storage devices, such as disk drives, or tape, the data stored on the device can be erased, accidentally or purposefully, by exposure to a sufficiently large magnetic field.

Therefore, a need exists for a system and method of monitoring field events that can potentially erase data stored on an MRAM device.

SUMMARY OF THE INVENTION

According to an embodiment of the present invention, a method for monitoring field events in an MRAM memory device comprises providing a first magnetic storage cell having a switching threshold less than or equal to a switching threshold of a second magnetic storage cell, writing the first magnetic storage cell in a first direction, reading the first storage cell at a time after the writing, and determining whether the first direction has changed, and upon determining the first direction to have changed indicating a warning.

The indication of the warning occurs at a field strength lower than a field strength of a data corruption event.

The method comprises performing a memory backup of the second magnetic storage cell to another memory device upon determining the first direction to have changed.

Indicating a warning comprises sending a message to a memory controller.

The method comprises providing a plurality of magnetic storage cells having switching thresholds less than or equal to the switching threshold of the second magnetic storage cell, wherein the plurality of magnetic storage cells have different thresholds. The switching thresholds of the plurality of magnetic storage cells are different switching thresholds and are known to a memory controller. The method further comprises monitoring a magnitude of a field event over time according to the different switching thresholds.

According to an embodiment of the present invention, a method for monitoring field events in an MRAM memory device comprises writing a pattern in a plurality of storage cells, storing the pattern in a different memory device, comparing the pattern written in the plurality of storage cells to the pattern stored in the different memory device at a time after the writing, and indicating a warning upon determining the pattern in the pattern written in plurality of storage cells to be different from the pattern stored in the different memory device.

According to an embodiment of the present invention, a method for monitoring field events in an MRAM memory device comprises writing a pattern in a first plurality of storage cells, writing the pattern in a second plurality of storage cells, reading the first and the second plurality of storage cells at a time after the writing, and indicating a warning upon determining the first and the second plurality of storage cells to have different patterns.

According to an embodiment of the present invention, a system for monitoring field events in an MRAM memory device comprises a magnetic random access memory device array comprising storage cells, and a magnetic toggle for detecting a field event in the magnetic random access memory device array, wherein an MTJ of the toggle has a switching threshold less than a switching threshold of a storage cell of the magnetic random access memory device array.

The MTJ comprises a flux guide for tuning the switching threshold of the MTJ to be less than the switching threshold of the storage cell of the magnetic random access memory device array.

The magnetic toggle has a length or a width different from a length or a width of a storage cell of the magnetic random access memory device array, wherein the different length or width of the MTJ tunes the switching threshold to be less than the switching threshold of the storage cell of the magnetic random access memory device array.

BRIEF DESCRIPTION OF THE DRAWINGS

Preferred embodiments of the present invention will be described below in more detail, with reference to the accompanying drawings:

FIG. 1b is an illustration of exemplary layers forming a single one of the magnetic cells of FIG. 1a;

DETAILED DESCRIPTION OF PREFERRED EMBODIMENTS

According to an embodiment of the present invention, MRAM memory devices can be monitored for magnetic field spikes that can cause data loss. The system and method advise a system that data loss has likely occurred, e.g., that a field event greater than a threshold has occurred.

It should be noted that throughout the specification the values of the memory cells are physical values and that one skilled in the art would recognize that logical values can be varied according to codes of, for example, a memory controller or application.

Figure 1A:
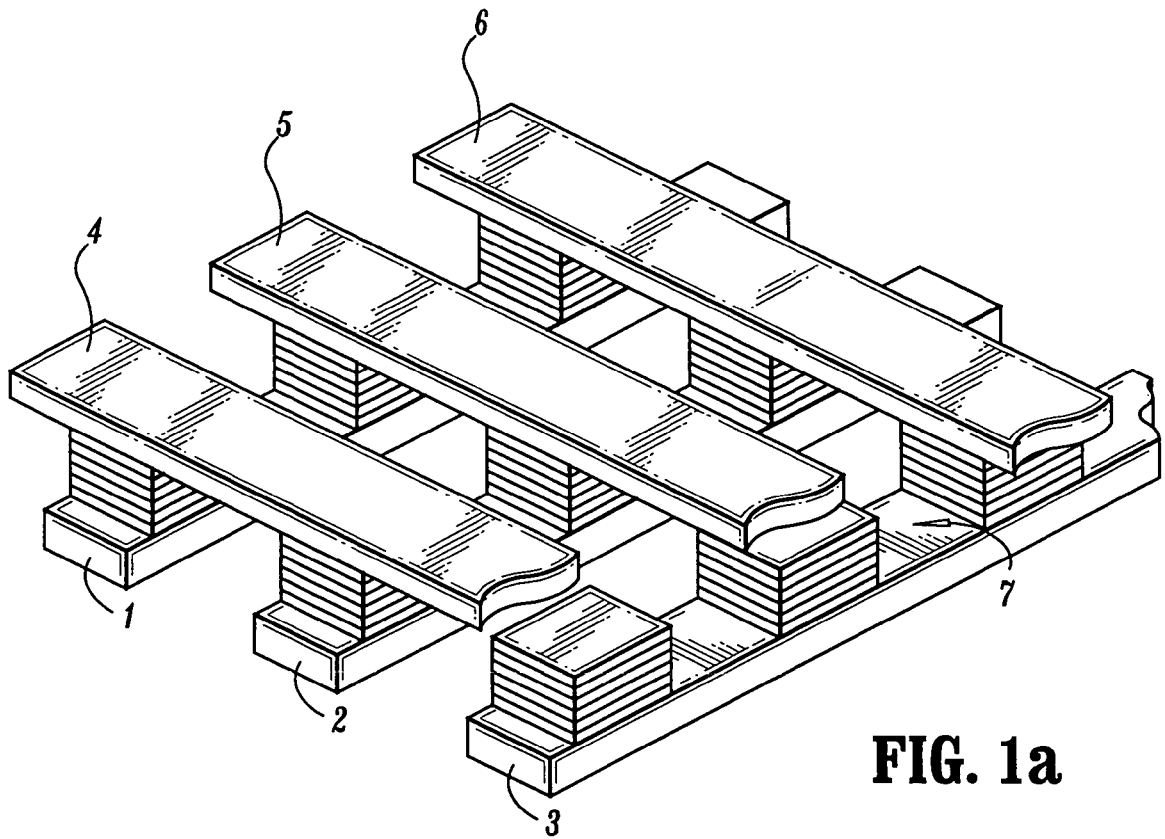
FIG. 1a is an illustration of an MRAM array having magnetic memory cells disposed at intersecting regions of crossing bit lines and word lines.
Figure 1B:
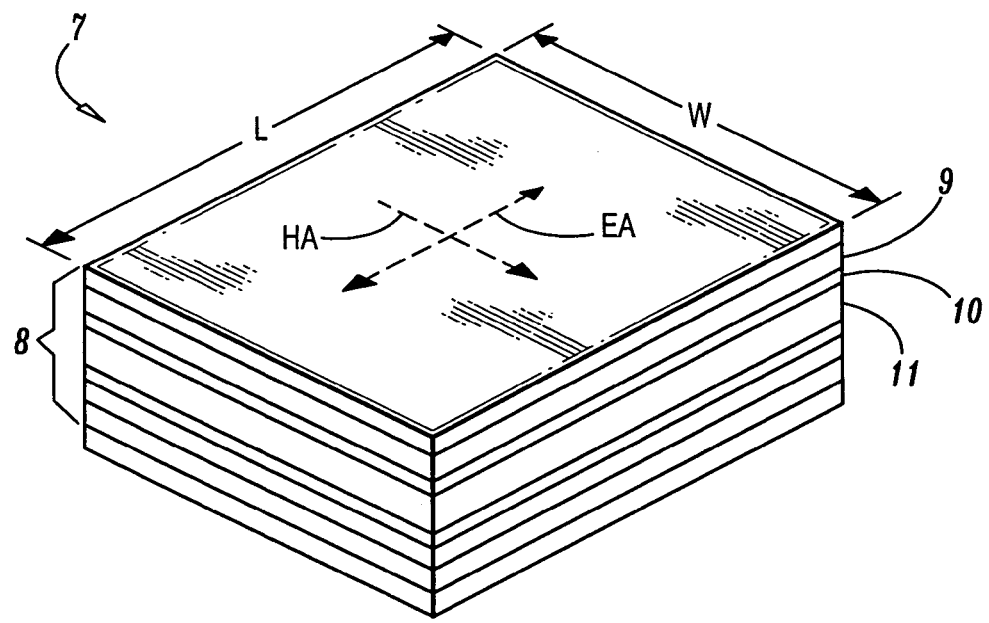
Figure 2:
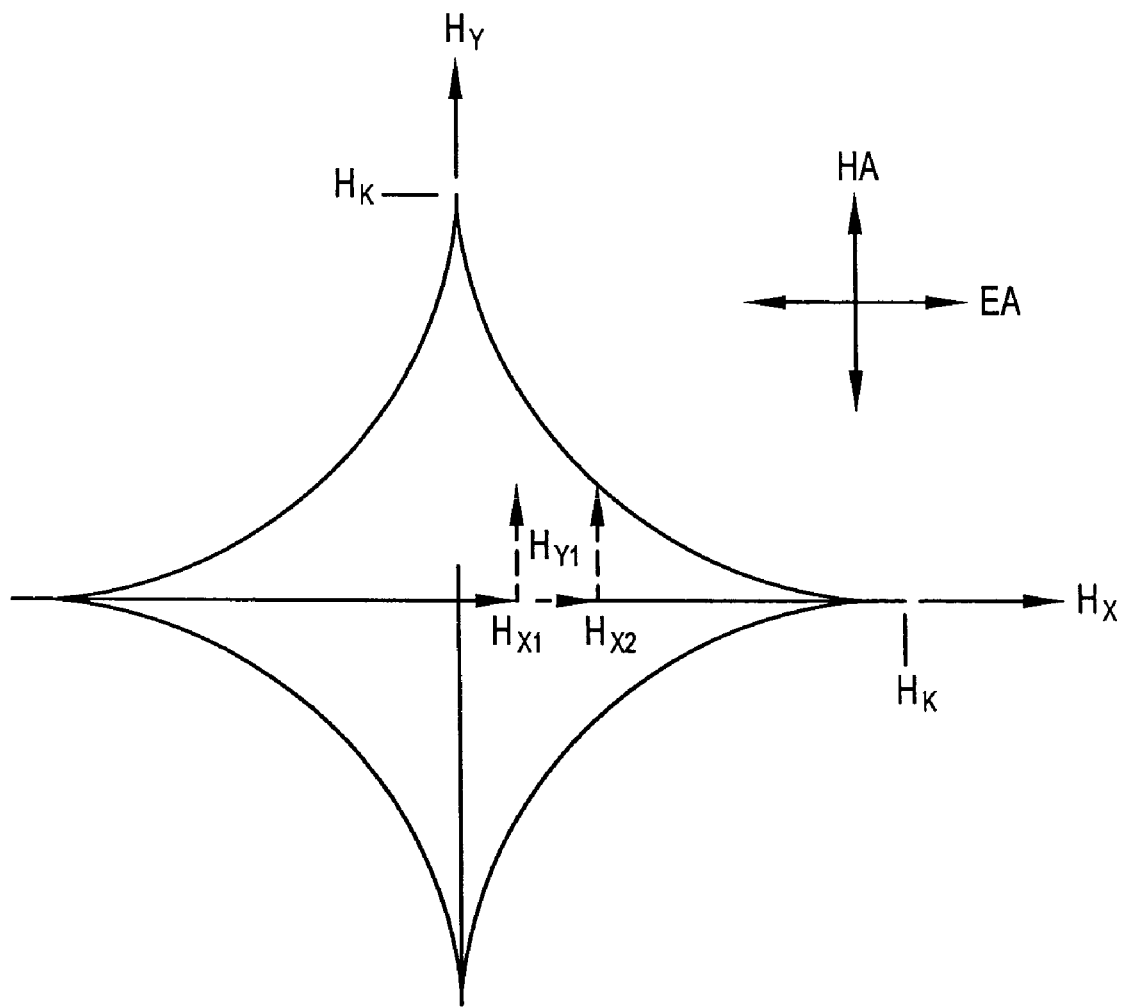
FIG. 2 is an astroid model of the magnetic response of a single, ideal magnetic tunnel junction.
Figure 3:
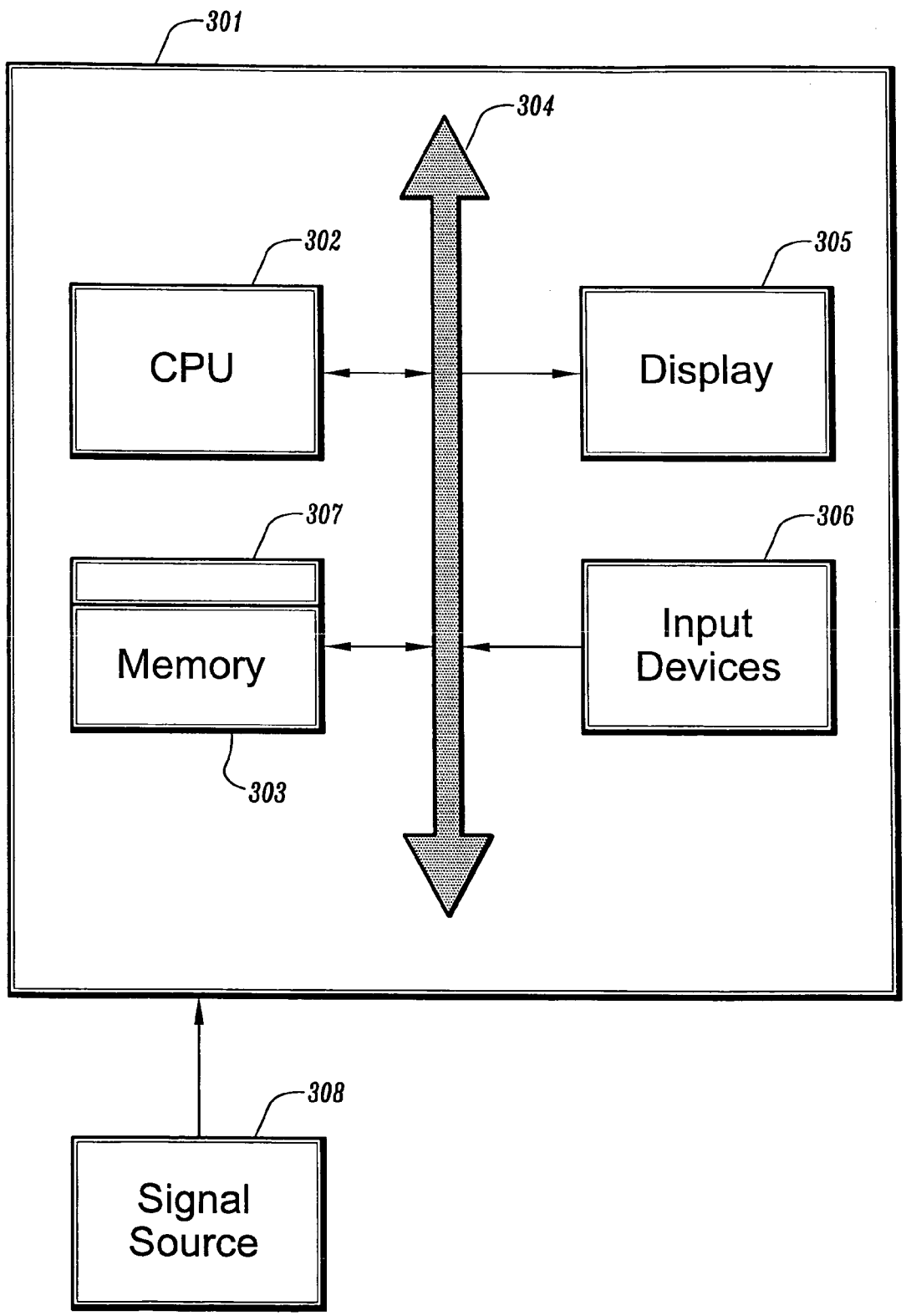
FIG. 3 is a diagram of a system according to an embodiment of the present invention.

Referring to FIG. 3, according to an embodiment of the present invention, a computer system 301 for implementing the present invention can comprise, inter alia, a central processing unit (CPU) 302, a memory 303 and an input/output (I/O) interface 304. The computer system 301 is generally coupled through the I/O interface 104 to a display 305 and various input devices 306 such as a mouse and keyboard. The support circuits can include circuits such as cache, power supplies, clock circuits, and a communications bus. The memory 303 can include MRAM, disk drive, tape drive, etc., or a combination thereof. The present invention can be implemented as the routine 307 that is stored in memory 303 and executed by the CPU 302 or memory controller to process the signal from the signal source 308. As such, the computer system 301 is a general purpose computer system that becomes a specific purpose computer system when executing the routine 307 of the present invention.

The system exhibits low or no power usage during monitoring operations. The monitor runs at all times, independently of whether the MRAM chip is powered up, reading or writing. The monitor is resettable after detection of a field event. The monitor accurately reflects thresholds needed to guard MRAM data.

According to an embodiment of the present invention, the monitor comprises one or more MTJ incorporated into the MRAM chip. Each monitor comprises a flux guide to enhance any magnetic field on the MTJ. A storage cell having a flux guide is more sensitive to field events, e.g., a magnetic spike, than a storage cell without a flux guide.

Flux guides are useful in magnetic sensors to channel magnetic flux. For example, the spatial resolution and directionality of the sensor is improved, making the sensor less sensitive to undesirable magnetic fields. Further, flux guides can be used to concentrate and increase the detectable field levels. The addition of a flux guide enhances a magnetic field, e.g., by 20% as measured by a sensor, over that which would be present without the flux guide.

The flux guide can be designed according to a known switching field of an MTJ. Thus, a magnetic threshold of a monitor comprises an MTJ and a flux guide can be set lower than a magnetic threshold of the storage cells of the MRAM. Another method for tuning the device is to tune the switching threshold of a tunnel junction. For example, the MTJs of a monitor can be sized differently than the storage cells for storing data of the memory device. The switching field is determined by a size/thickness/magnitude of a magnetic field proportional to the length and width of a storage cell. The larger the storage cell the smaller the switching field will be.

A monitor provides a warning margin for field exposure. The monitor or monitors are polled on a timely basis, for example, according to a single clock cycle or multiple clock cycles of the MRAM chip. Two or more monitors comprise a latch. Each latch comprises a pair of complementary memory cells, each memory cell having an MTJ. A latch indicates exposure to magnetic fields if a value read from the latch is not the same as a value previously written to the latch.

Monitors with different field cutoffs can be included, for example, by tuning the flux guide dimensions or magnetic properties of different monitors to be responsive to different magnetic field strengths. Depending on the MRAM chip application, different cutoffs can be used for error correction (ECC) or warnings. For example, field strengths below data-loss levels can trigger user warnings or initiate backup to nonmagnetic RAM. The monitors can be tuned according to a field strength needed to affect data loss in the particular MRAM application.

According to an embodiment of the present invention, a latch comprises two MTJs written in different directions, e.g., opposite directions. The state of each MTJ is monitored. A data corruption event can be determined if the direction of either MTJ changes. For example, where the MTJs are written in different directions, if it is determined that the two MTJs have the same state a warning can be issued. That is, to have both MTJs of the same state, after writing the MTJs in opposite directions, a field pulse exceeding a threshold magnitude needs to occur. The warning is issued at a field strength lower than a field strength of a data corruption event, e.g., about 15% of the field strength of a data corruption event. One of ordinary skill in the art would appreciate that with increases in the performance of MRAM devices, e.g., speed, the threshold at which a warning is indicated can be closer to the field strength of a data corruption event.

A latch can comprise two of more MTJs implemented in a pattern for monitoring field events. The latch, including the flux guides and/or modified MTJs, can be implemented in a dedicated portion of a memory device, or can be distributed throughout the memory device. Similarly, where two or more latches are utilized, two patterns can be written to the memory device. The patterns are monitored such that, if it is determined upon readback that the patterns do not match, a warning can be issued. The pattern can be written to a dedicated portion of the memory device, or written through the memory device.

Monitors can be arranged as a field event monitor, comprising a plurality of MTJs having different switching thresholds and a logic for performing an analysis of a field event. The logic can be on or off the memory chip. Off memory chip analysis can be performed by a memory controller.

A set of different MTJs having various known switching thresholds can be provided to track the severity of a field event over time. The switching thresholds of the MTJs can be set to, for example, 10%, 50%, and 80% of a switching threshold for storage cells for storing data. The severity of the field event is monitored by the memory controller for determining whether an action is to be taken.

Figure 4:
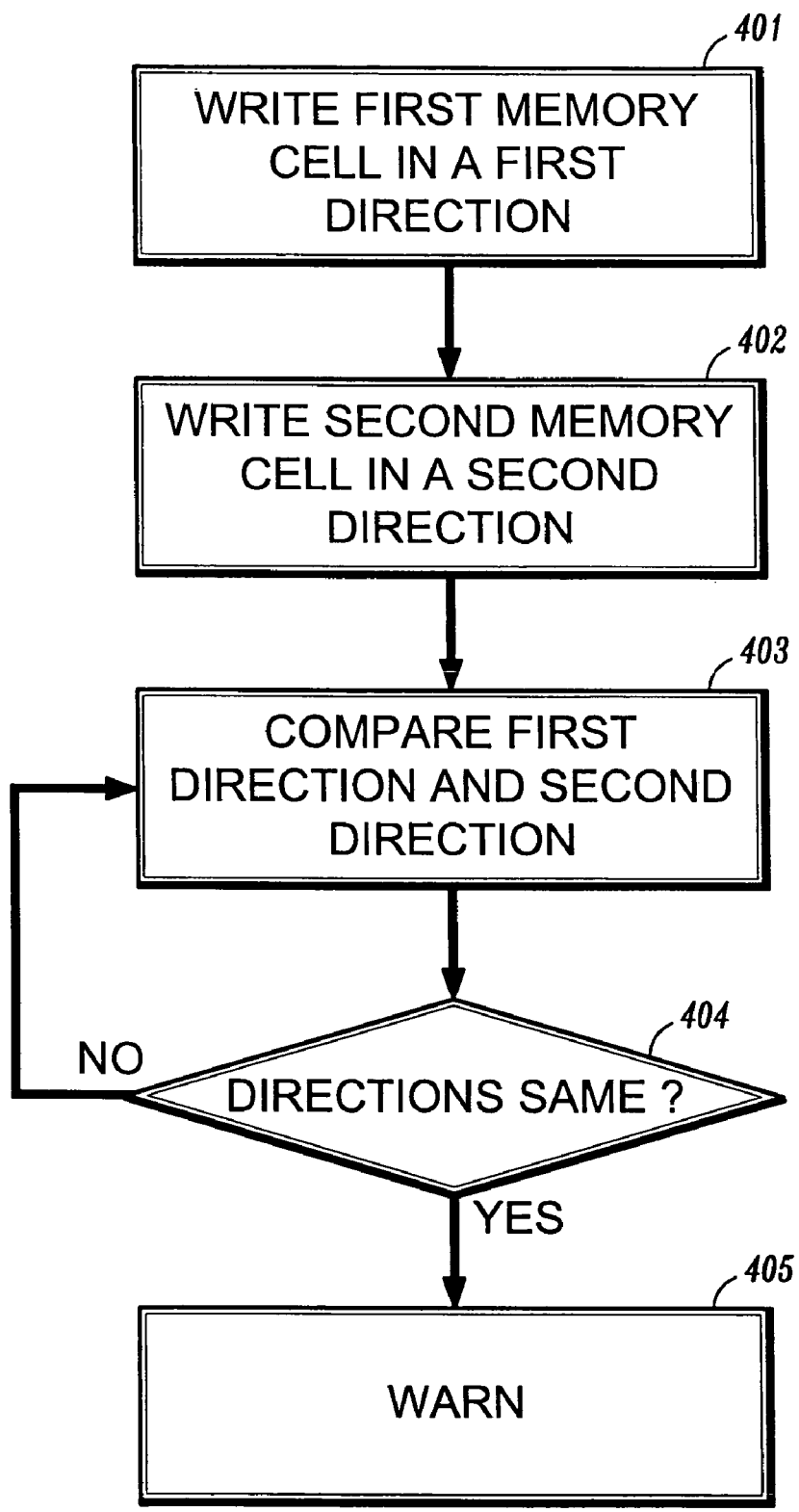
FIG. 4 is a flow chart of a method according to an embodiment of the present invention.

Referring to FIG. 4, a first memory cell is written in a first direction 401 and a second memory cell is written in a second direction 402. The first and the second memory cells are monitored over time after writing 403. The directions of the first memory cell and the second memory cell are compared 404. If the first or the second direction are the same, a message can be issued to a memory controller 405. The memory controller can take appropriate action, for example, saving data stored in the magnetic memory to a different type of memory. Thus, the memory controller monitors the first and second memory cells for a change in the relative states. Accordingly, the first direction and the second direction can be the same direction or different directions known to the memory controller or other memory monitoring device.

Figure 5:
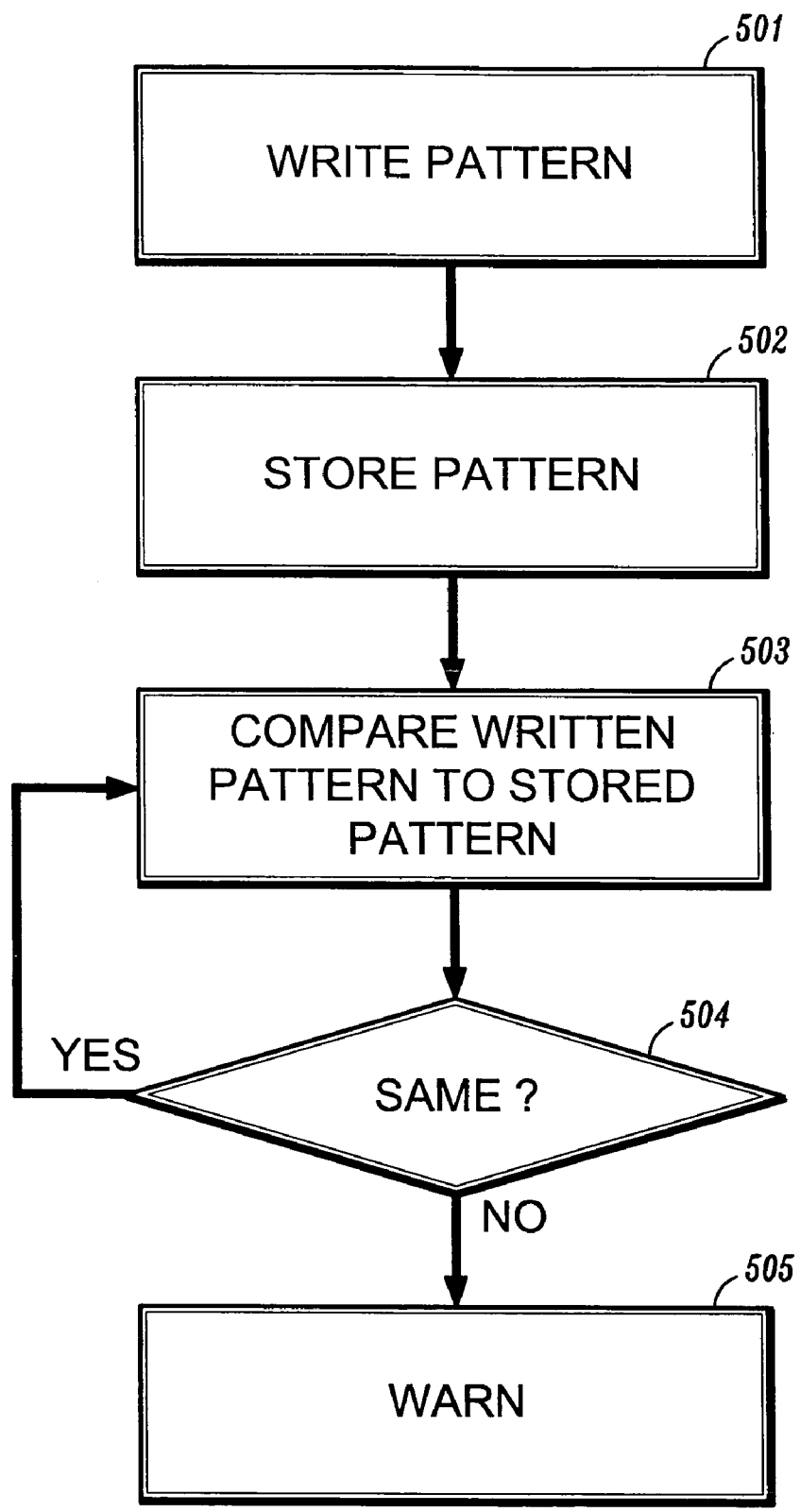
FIG. 5 is a flow chart of a method according to an embodiment of the present invention.

Referring to FIG. 5, a pattern is written to a set of MTJs in a memory device 501. The pattern is stored in another memory device 502. The written pattern is compared to the stored pattern 503. If the written pattern is different than the stored pattern a message can be issued to a memory controller 504. Two latches, each comprising a set of MTJs, can be written having the same pattern. The two latches can be compared to determine whether they have different patterns to trigger a message to the memory controller.

Figure 6:
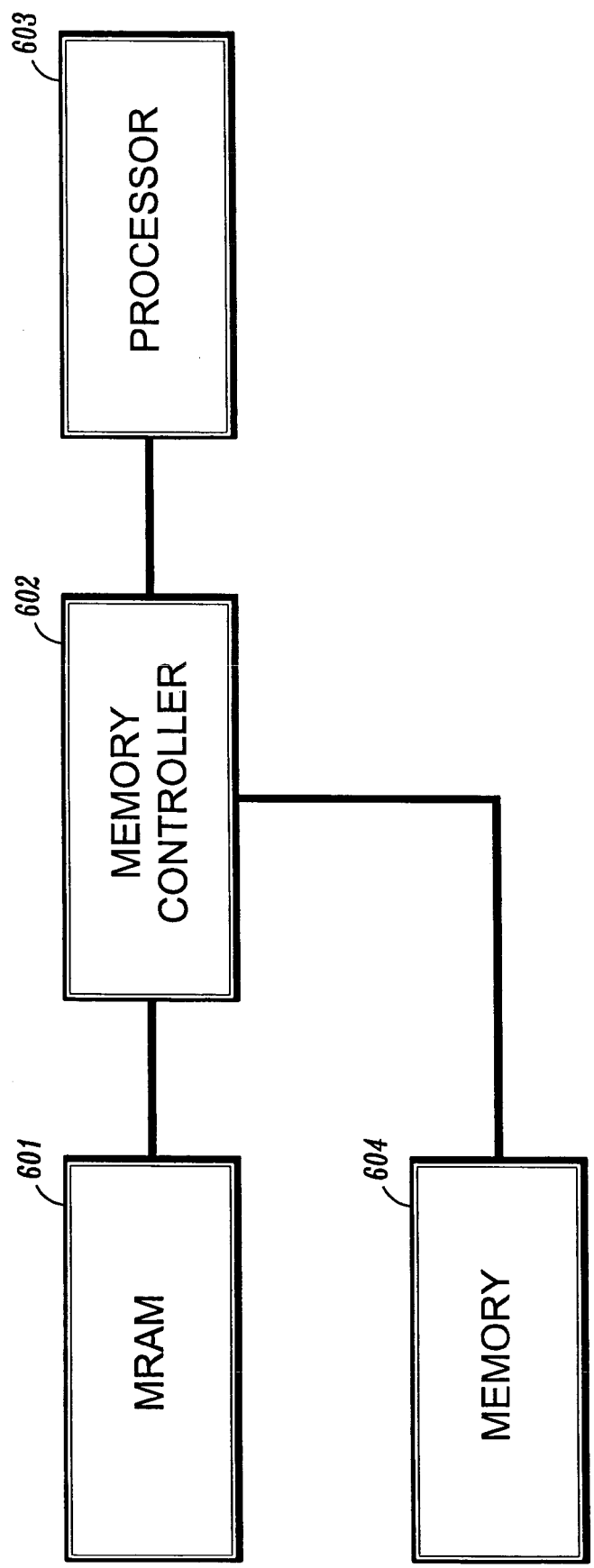
FIG. 6 is an illustration of a system according to an embodiment of the present invention.

Referring to FIG. 6, a system comprising an MRAM device 601, a memory controller coupled to the MRAM device 602, and a processor 603. The memory controller 602 receives messages from the MRAM device. The messages comprise values stored in MTJs. Depending on the monitoring logic, e.g., comparing two patterns written to latches in the MRAM device 601, or comparing a value of an MTJ or latch to a value stored elsewhere, the memory controller 602 can take appropriate measures to prevent or ameliorate data loss due to a field event. For example, the memory controller 602 can move data stored on the MRAM device 601 to another memory 604, such as a disk drive or DRAM. The logic for taking an action upon determining a field event can be stored on the MRAM chip 601, in the memory controller 602, or any other suited device. Further, the logic has knowledge of the switching thresholds of individual latches. Thus, the severity of a field event can be tracked over time as latches having different switching thresholds are found to change as a field event increases in magnitude.

Figure 7A:
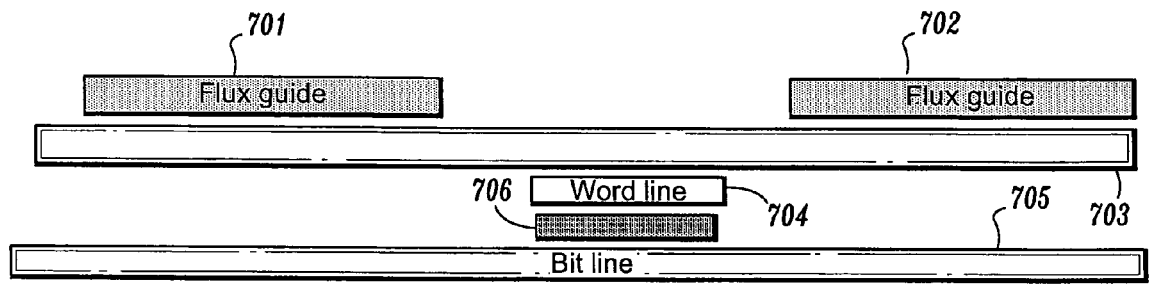
FIGS. 7a and 7d are illustrations of a flux guide according to an embodiment of the present invention.
Figure 7B:
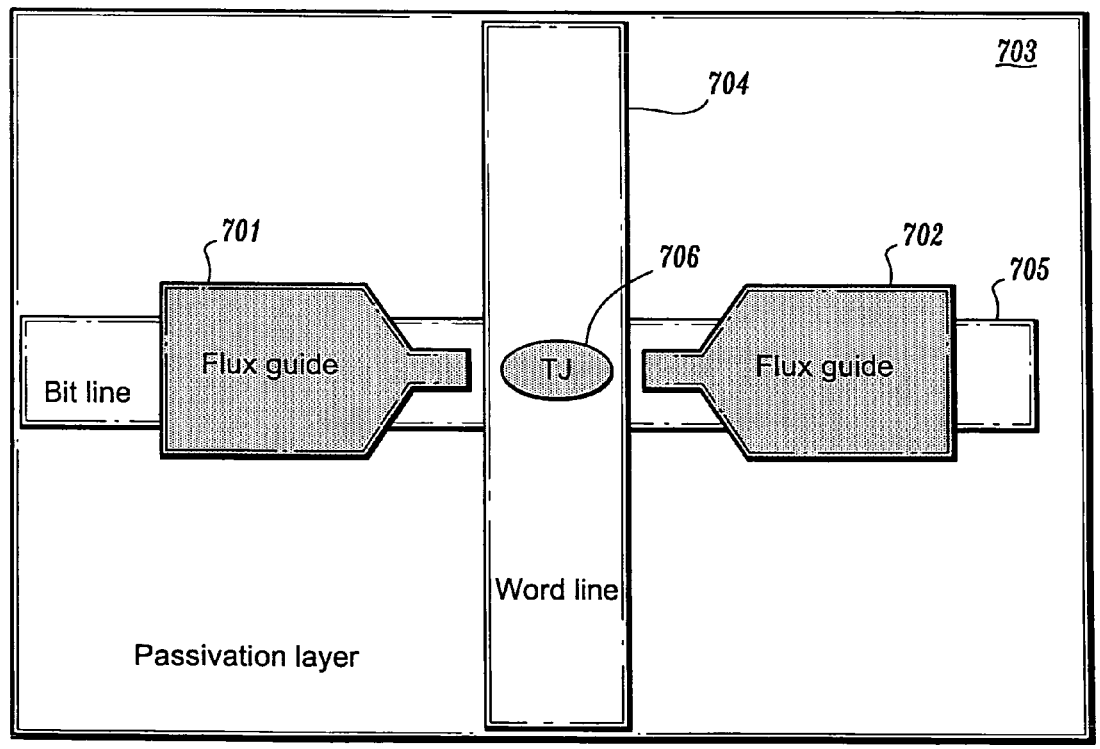
Figure 7C:
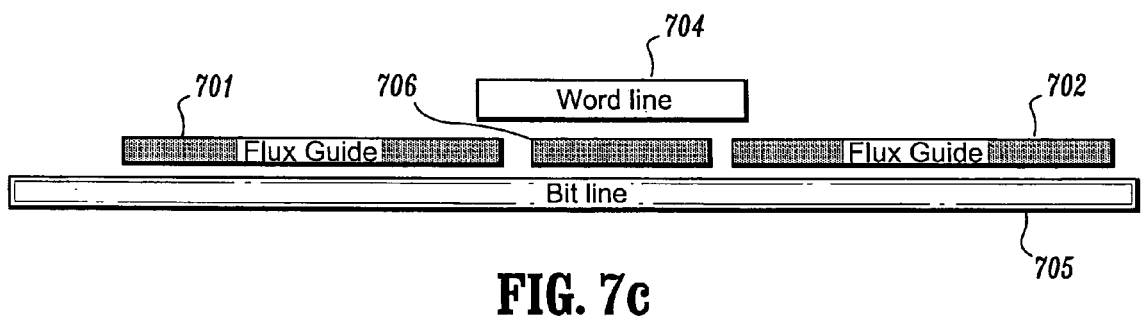
Figure 7D:
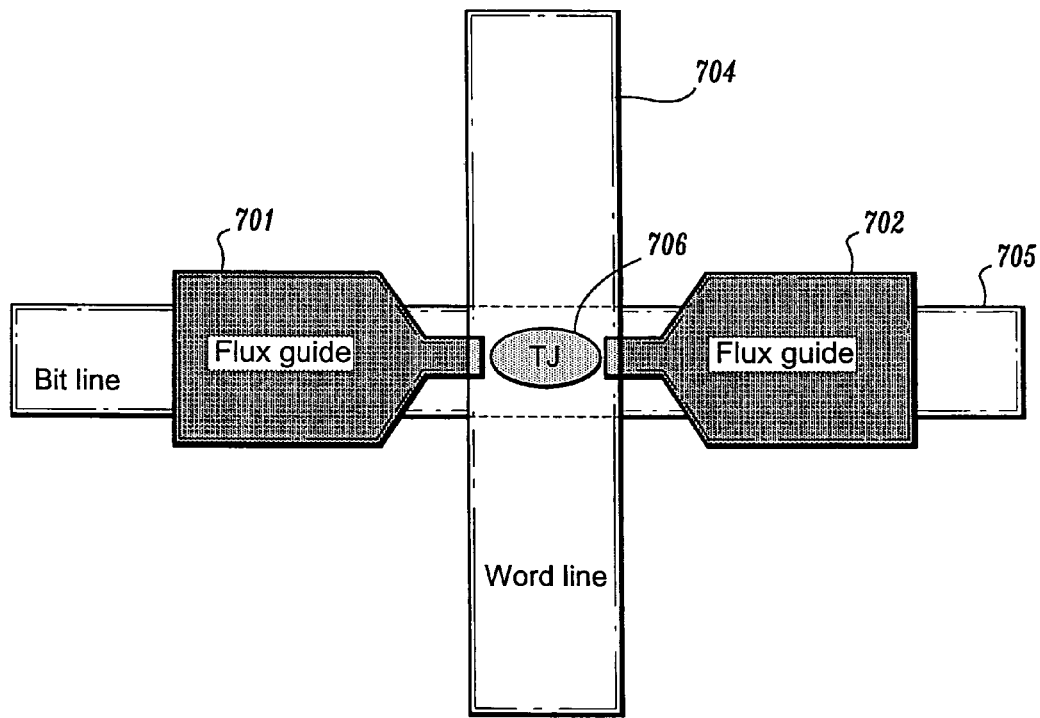

While the structure of the flux guides can vary, according to an embodiment of the present invention, flux guides 701 and 702 are formed above a passivation layer 703. At a junction of a wordline 704 and a bitline 705, a MTJ 706 is formed. The flux guides 701 and 702 can be aligned along the bitline 705. Referring to FIGS. 7c and 7d, flux guides 701 and 702 are fabricated from the MTJ material layer. Alternatively, the flux guides 701 and 702 are fabricated from magnetic layers deposited at the same time as the MTJ material. As shown in FIGS. 7c and 7d, the flux guides 701 and 702 can be formed in the same step as the tunnel junction.

Having described preferred embodiments of a system and method for monitoring MRAM devices, it is noted that modifications and variations can be made by persons skilled in the art in light of the above teachings. It is therefore to be understood that changes can be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method for monitoring field events in an MRAM memory device comprising:

providing a first magnetic storage cell having a switching threshold less than a switching threshold of a second magnetic storage cell;

writing the first magnetic storage cell in a first direction;

reading the first storage cell at a time after the writing; and determining whether the first direction has changed, and upon determining the first direction to have changed indicating a warning, wherein the indication of the warning occurs at a field strength lower-than a field strength of a data corruption event of the second magnetic storage cell.

2. The method of claim 1, further comprising performing a memory backup of the second magnetic storage cell to another memory device upon determining the first direction to have changed.

3. The method of claim 1, wherein indicating a warning comprises sending a message to a memory controller.

4. The method of claim 1, further comprising providing a plurality of magnetic storage cells having switching thresholds less than the switching threshold of the second magnetic storage cell.

5. The method of claim 4, wherein the plurality of magnetic storage cells have different thresholds.

6. The method of claim 4, wherein the switching thresholds of the plurality of magnetic storage cells are different switching thresholds and are known to a memory controller.

7. The method of claim 6, further comprising monitoring a magnitude of a field event over time according to the different switching thresholds.

8. A system for monitoring field events in an MRAM memory device comprising:
   a magnetic random access memory device array comprising storage cells; and
   a magnetic toggle for detecting a field event in the magnetic random access memory device array, wherein the magnetic toggle has a switching threshold less than a switching threshold of a storage cell of the magnetic random access memory device array.

9. The system of claim 8, wherein the magnetic toggle comprises a flux guide for tuning the switching threshold of the magnetic toggle to be less than the switching threshold of the storage cell of the magnetic random access memory device array.

10. The system of claim 8, wherein the magnetic toggle has a length or a width different from a length or a width of a storage cell of the magnetic random access memory device array, wherein the different length or width of the magnetic toggle tunes the switching threshold to be less than the switching threshold of the storage cell of the magnetic random access memory device array.

11. A method for monitoring field events in an MRAM memory device comprising:
   providing a plurality of first magnetic storage cells having a switching threshold less than a switching threshold of a second magnetic storage cell;
   writing the first magnetic storage cells in a first pattern;
   reading the first storage cells at a time after the writing; and
   determining whether the first pattern has changed, and upon determining the first pattern to have changed indicating a warning.

* * * * *